(12) United States Patent
Kono et al.

(10) Patent No.: US 8,717,332 B2
(45) Date of Patent: May 6, 2014

(54) PLANAR ELEMENT, AND TOUCH SWITCH

(75) Inventors: Katsumasa Kono, Moriyama (JP); Hideaki Mizumoto, Moriyama (JP)

(73) Assignee: Gunze Limited, Kyoto (JP)

(*) Notice: Subject to any disclaimer, the term of this patent is extended or adjusted under 35 U.S.C. 154(b) by 0 days.

(21) Appl. No.: 13/000,634

(22) PCT Filed: Jul. 27, 2009

(86) PCT No.: PCT/JP2009/063355
§ 371 (c)(1),
(2), (4) Date: Dec. 22, 2010

(87) PCT Pub. No.: WO2010/013679
PCT Pub. Date: Feb. 4, 2010

(65) Prior Publication Data
US 2011/0102370 A1 May 5, 2011

(30) Foreign Application Priority Data

Jul. 31, 2008 (JP) ................................ 2008-198419
May 8, 2009 (JP) ................................ 2009-113755

(51) Int. Cl.
*G06F 3/045* (2006.01)

(52) U.S. Cl.
USPC ......... 345/174; 345/173; 178/18.06; 200/600

(58) Field of Classification Search
USPC ................. 345/173–174; 200/600; 178/18.01–18.11
See application file for complete search history.

(56) References Cited

U.S. PATENT DOCUMENTS

| 5,338,226 A | 8/1994 | Bryce et al. |
| 5,844,506 A | 12/1998 | Binstead |
| 6,307,166 B1 * | 10/2001 | Watanabe et al. .......... 178/18.05 |
| 6,970,160 B2 | 11/2005 | Mulligan et al. |
| 7,129,935 B2 | 10/2006 | Mackey |
| 7,348,966 B2 * | 3/2008 | Hong et al. ................... 345/173 |
| 2004/0119701 A1 | 6/2004 | Mulligan et al. |
| 2004/0239650 A1 * | 12/2004 | Mackey ........................ 345/174 |

(Continued)

FOREIGN PATENT DOCUMENTS

| CN | 1728071 A | 2/2006 |
| EP | 2 260 367 A2 | 12/2010 |

(Continued)

OTHER PUBLICATIONS

International Preliminary Report on Patentability dated Jul. 2, 2010 for the corresponding International patent application No. PCT/JP2009/063355 (with English translation).

(Continued)

*Primary Examiner* — Koosha Sharifi-Tafreshi
(74) *Attorney, Agent, or Firm* — Posz Law Group, PLC

(57) ABSTRACT

The present invention provides a touch switch having two ITO-free electrode layers that are bonded together, the touch switch having good visibility, and a planar body that forms such a touch switch. The planar body includes a mesh-like electrode formed in a mesh shape by multiple conductor lines L on one side of a substrate, in which the mesh-like electrode is separated into multiple conductive areas disposed at intervals, and non-conductive areas each disposed between each of the conductive areas; each non-conductive area has multiple cutting portions that cut the conductor lines L, and each non-conductive area insulates between the adjacent conductive areas by the cutting portions.

9 Claims, 17 Drawing Sheets

(56) References Cited

U.S. PATENT DOCUMENTS

| | | | |
|---|---|---|---|
| 2006/0097991 A1* | 5/2006 | Hotelling et al. | 345/173 |
| 2007/0063983 A1 | 3/2007 | Huang et al. | |
| 2008/0084377 A1 | 4/2008 | Tateuchi et al. | |
| 2008/0138589 A1 | 6/2008 | Wakabayashi et al. | |
| 2009/0194344 A1* | 8/2009 | Harley et al. | 178/18.06 |
| 2009/0213090 A1* | 8/2009 | Mamba et al. | 345/174 |
| 2009/0219257 A1* | 9/2009 | Frey et al. | 345/173 |
| 2009/0219258 A1* | 9/2009 | Geaghan et al. | 345/173 |
| 2009/0273572 A1* | 11/2009 | Edwards et al. | 345/173 |
| 2010/0123670 A1* | 5/2010 | Philipp | 345/173 |
| 2010/0164889 A1* | 7/2010 | Hristov et al. | 345/173 |

FOREIGN PATENT DOCUMENTS

| | | |
|---|---|---|
| JP | H07-006827 U | 1/1995 |
| JP | H11-110115 A | 4/1999 |
| JP | 2006-344163 A | 12/2006 |
| JP | 2007-142334 A | 6/2007 |
| JP | 2007-157107 A | 6/2007 |
| JP | 2007-179561 A | 7/2007 |
| JP | 2008-032884 A | 2/2008 |
| JP | 2008-096553 A | 4/2008 |
| WO | WO 95/27334 | 10/1995 |
| WO | WO 02/100074 | 12/2002 |
| WO | WO 2004/061808 A2 | 7/2004 |
| WO | WO 2006/126604 | 11/2006 |
| WO | WO 2007/146779 | 12/2007 |
| WO | WO 2009/108758 | 9/2009 |

OTHER PUBLICATIONS

Supplementary European Search Report mailed Oct. 5, 2011 in corresponding European patent Application No. 09802922.6.
International Search Report mailed on Oct. 13, 2009 for the corresponding International patent application No. PCT/JP2009/063355.

* cited by examiner (a)

(b)

PLANAR ELEMENT, AND TOUCH SWITCH

CROSS REFERENCE TO RELATED APPLICATIONS

This application is a U.S. national stage application of PCT/JP2009/063355 filed on Jul. 27, 2009, and claims priority to, and incorporates by reference, Japanese Patent Applications No. 2008-198419 filed on Jul. 31, 2008 and No. 2009-113755 filed on May 8, 2009.

TECHNICAL FIELD

The present invention relates to a planar body and a touch switch.

BACKGROUND ART

These days, in the field of computers and electronic devices, operations performed using the contents displayed on a display device, rather than using buttons, have been increasingly developed. To perform such operations, a touch switch is arranged at the front side of the display device, and a touch position is detected. The types of touch switches include a resistive type, a surface acoustic wave type, an infrared type, and the like. There is also a capacitive type, in which a position is detected by a variation in capacitance caused by a touch of a finger and/or proximity of a finger. For example, Patent Literature 1 discloses a capacitive touch switch having a matrix electrode (a two-layer structure in X-direction and Y-direction), as shown in FIGS. 19 and 20.

A detailed description is provided with reference to FIG. 21, which is a schematic plan diagram schematically showing the structure of a capacitive touch switch as described above; and FIG. 22, which is a cross-sectional view of the structure. A known capacitive touch switch 400 comprises a first planar body 403 having a substrate 401 and transparent first electrodes 402 comprising ITO, and arranged in a strip pattern on one side of the substrate 401; and a second planar body 406 having a substrate 404 and transparent second electrodes 405 comprising ITO, and arranged in a strip pattern on one side of the substrate 404. The first planar body 403 and the second planar body 406 are bonded via an adhesive layer 407 in such a manner that the first electrodes and second electrodes face each other.

When an arbitrary position on the planar body is touched with a finger or the like, the electrodes 402 and 405 detect a change in the voltage or the like based on the capacitance of a human body at the contact position, and a coordinate of the contact position is thereby calculated.

However, the resistivity of ITO is high, usually 200Ω/☐ to 1000Ω/☐. This results in an increase in the size of the touch switch, along with an increase in the resistance between terminals of the electrodes. This reduces the detection sensitivity of the capacitance, and disables the operation of the touch switch.

Further, Patent Literature 2 discloses a capacitive touch switch that does not use ITO. A copper or copper-alloy electrode is formed in a mesh pattern, thereby allowing the transmission of the electrode to be 70% or higher. A low-resistance electrode is formed while maintaining the visibility.

However, the electrodes in Patent Literature 2 are only provided on one side of the substrate. When two layers of electrodes are formed using the first electrodes and the second electrodes, as described in Patent Literature 1, the visibility will be reduced when the first planar body is overlapped with the second planar body.

CITATION LIST

Patent Literature

PLT 1: Japanese Unexamined Patent Publication No. 2006-511879
PLT 2: Japanese Unexamined Patent Publication No. 2006-344163

SUMMARY OF INVENTION

Technical Problem

An object of the present invention is to provide a touch switch having two ITO-free electrode layers bonded together, wherein the touch switch has good visibility; and to provide a planar body that forms such a touch switch.

Solution to Problem

The above-described object of the present invention is achieved by a planar body including a mesh-like electrode formed in a mesh shape with multiple conductor lines on one side of a substrate, in which the mesh-like electrode is separated into multiple conductive areas disposed at intervals and non-conductive areas each disposed between the conductive areas; each non-conductive area has multiple cutting portions that cut the conductor lines, and each non-conductive area insulates between the adjacent conductive areas by the cutting portions.

In this planar body, the cutting portions are preferably formed at intersections of the conductor lines of the mesh-like electrode.

Further, the mesh pitch of the mesh-like electrode is preferably 100 μm to 1,000 μm.

Further, the conductive areas preferably have multiple cutting portions that cut the conductor lines without interfering with the conductivity between the ends of each conductive area.

The above-described object of the present invention is also achieved by a capacitive touch switch including the multiple planar bodies, in which the planar bodies are bonded together via an adhesive layer.

Further, in this touch switch, the conductive areas formed on one planar body are preferably disposed to perpendicularly intersect the conductive areas formed on a different planar body.

The above-described object of the present invention is also achieved by a touch switch including a substrate; multiple first electrodes formed on one side of the substrate and arranged at certain intervals; and multiple second electrodes formed on the other side of the substrate and arranged at certain intervals to form a grid pattern with the multiple first electrodes, in which each of the first and second electrodes forms a mesh structure with multiple conductor lines, and the direction of the conductor lines is inclined with respect to a black matrix in a display device.

The above-described touch switch includes first auxiliary lines formed between the first electrodes on the one side of the substrate; and second auxiliary lines formed between the second electrodes on the other side thereof; in which a grid pattern with equal intervals is preferably formed by the conductor lines of the first electrodes, the first auxiliary lines, the conductor lines of the second electrodes, and the second auxiliary lines.

Further, the conductor lines of the first electrodes, the first auxiliary lines, or both of them formed on the one side of the substrate form continuous lines with the conductor lines of the second electrodes, the second auxiliary lines, or both of them formed on the other side of the substrate.

The above-described object of the present invention is also achieved by a touch switch including a first substrate; a second substrate disposed facing the first substrate; multiple first electrodes formed on the first substrate, specifically on a side facing the second substrate, and arranged at certain intervals; and multiple second electrodes formed on the second substrate, specifically on a side away from the first substrate, and arranged at certain intervals to form a grid pattern with the multiple first electrodes, in which each of the first and second electrodes form a mesh structure with multiple conductor lines, and the direction of the conductor lines is inclined with respect to a black matrix in a display device.

The touch switch includes first auxiliary lines formed between the first electrodes on the first substrate, specifically on the side facing the second substrate; and second auxiliary lines formed between the second electrodes on the second substrate, specifically on the side away from the first substrate, in which a grid pattern with equal intervals is preferably formed by the conductor lines of the first electrodes, the first auxiliary lines, the conductor lines of the second electrodes, and the second auxiliary lines.

Further, the conductor lines of the first electrodes, the first auxiliary lines, or both of them formed on the first substrate form continuous lines with the conductor lines of the second electrodes, the second auxiliary lines, or both of them formed on the second substrate.

Advantageous Effects of Invention

The present invention provides a touch switch having two ITO-free electrode layers bonded to each other, wherein the touch switch has good visibility; and also provides a planar body that forms such a touch switch.

BRIEF DESCRIPTION OF DRAWINGS

FIG. 2(a) shows first electrodes and first auxiliary lines, and FIG. 2(b) shows second electrodes and second auxiliary lines.

FIG. 7(a) shows first electrodes and first auxiliary lines, and FIG. 7(b) shows second electrodes and second auxiliary lines.

DESCRIPTION OF EMBODIMENTS

First Embodiment

A touch switch according to a first embodiment of the present invention is described with reference to the drawings. The touch switch is a capacitive touch switch mounted to a front side of a display device. A black matrix forming a grid pattern of horizontal and vertical lines is formed in the display device.

Figure 1:
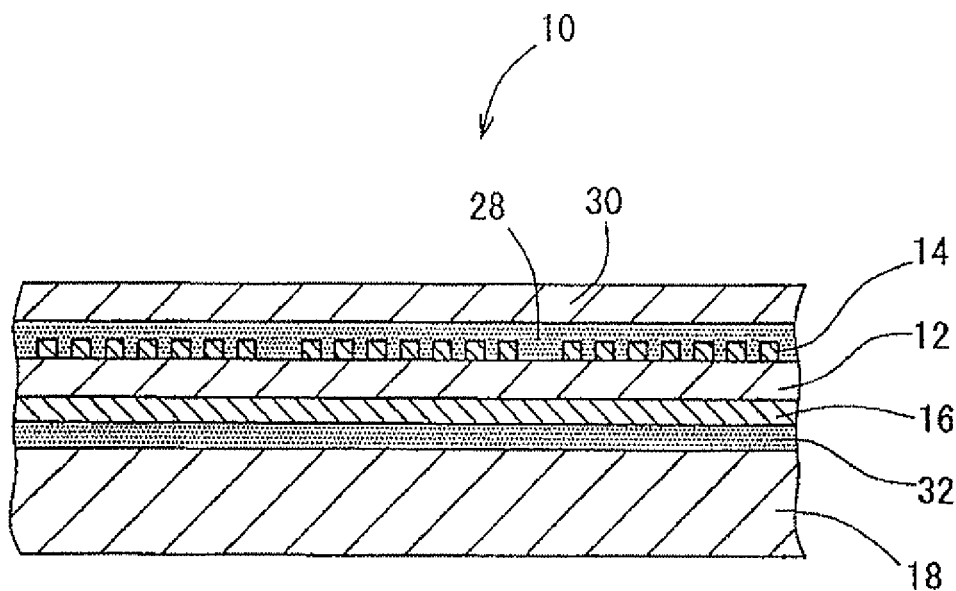
FIG. 1 shows a partial cross section of a touch switch according to a first embodiment of the present invention.

A touch switch 10 shown in FIG. 1 includes a substrate 12, first electrodes 14 formed on one side of the substrate 12, and second electrodes 16 formed on the other side of the substrate 12. In the description, the "one side" of the substrate 12 is an upper side, and the "other side" of the substrate 12 is a lower side, which is mounted to a display device 18.

The substrate 12 is a dielectric substrate. Examples of materials of the substrate 12 include transparent materials such as glass, polyester, polyethylene terephthalate, polycarbonate, polymethylmethacrylate, polyethylene naphthalate, etc. In the case of glass, the thickness is about 0.1 to 2 mm. In the case of plastic film, the thickness is about 10 to 2,000 μm.

Figure 2:
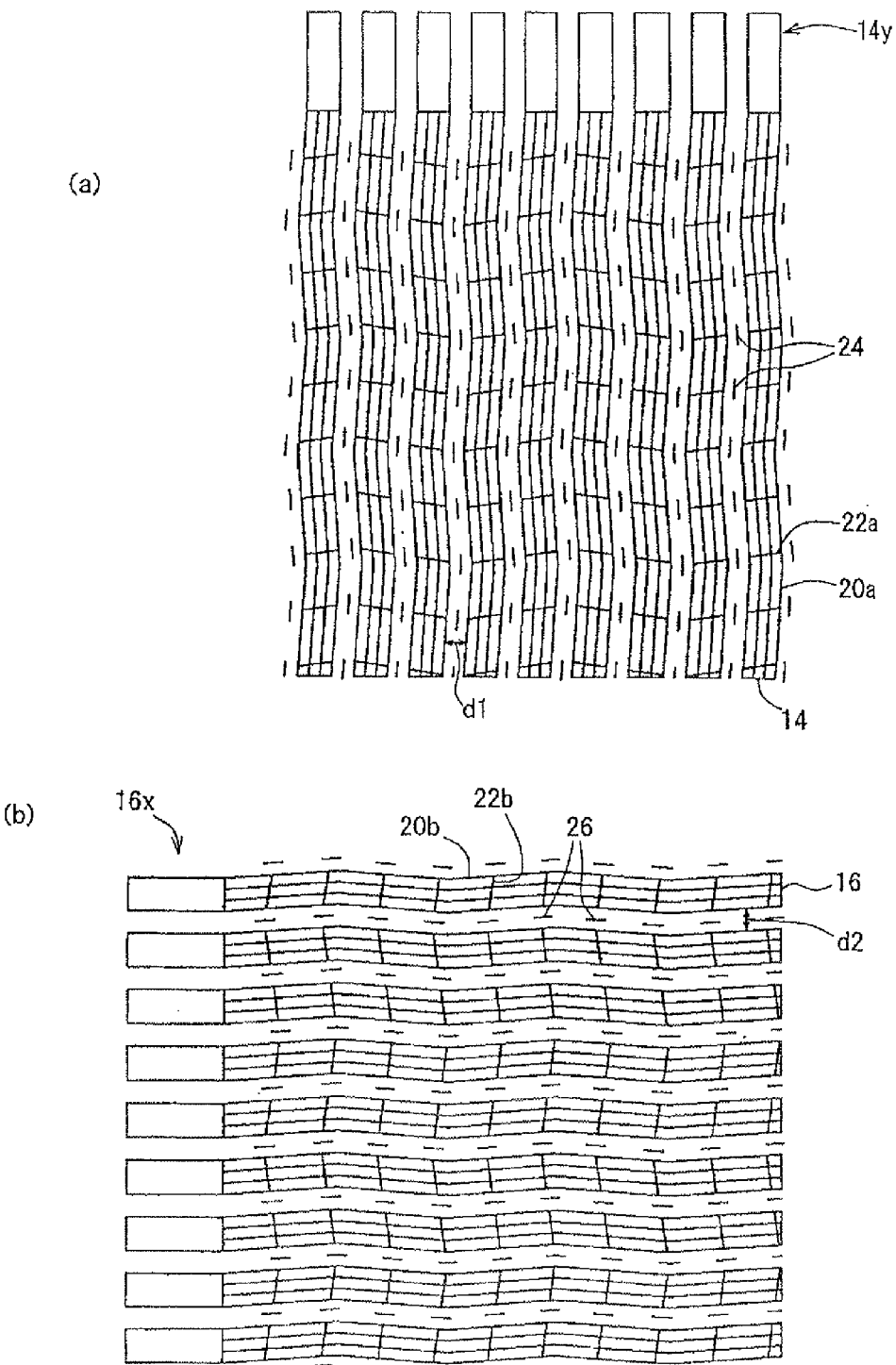
FIG. 2 shows electrodes and auxiliary lines of the touch switch.
Figure 3:
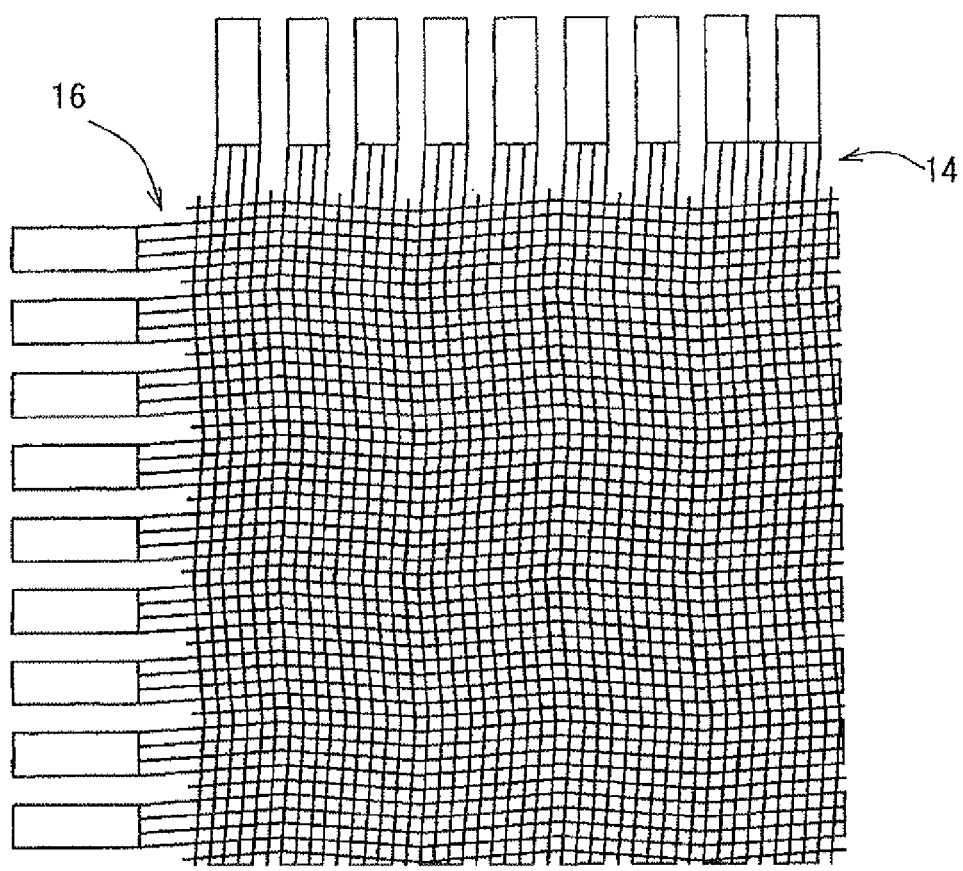
FIG. 3 shows a positional relationship of the first electrodes, the first auxiliary lines, the second electrodes, and the second auxiliary lines.

As shown in FIG. 2, the first electrodes 14 and the second electrodes 16 are all arranged at certain intervals. The first electrodes 14 and the second electrodes 16 are oriented in mutually perpendicularly intersecting directions. As shown in FIG. 3, the first electrodes 14 and the second electrodes 16 form a grid pattern.

Each of the first electrodes 14 and second electrodes 16 has multiple conductor lines, and forms a mesh structure with the conductor lines. The conductor lines include long lines 20a and 20b, and multiple short lines 22a and 22b that intersect the long lines 20a and 20b. The long lines 20a and 20b and the short lines 22a and 22b are all disposed inclined with respect to the black matrix in the display device 18. This is because a moiré pattern would easily occur if the conductor lines and the black matrix were oriented in the same direction.

The long lines 20a and 20b curve at certain positions. The angle of the curve is the same at each position. The angle of the curve is an angle (bias angle) at which a moiré pattern does not occur along the vertical or horizontal axis of the display device 18. The long lines 20a of the first electrodes 14 and the short lines 22b of the second electrodes 16 are oriented in the same direction, and the short lines 22a of the first electrodes 14 and the long lines 20b of the second electrodes 16 are oriented in the same direction. The line width of the long lines 20a and 20b and the short lines 22a and 22b is, for example, about 10 to 30 μm. The pitch of the long lines 20a and 20b is about 200 to 400 μm. Because the line width is very thin and the pitch is sufficiently large relative to the line width, the electrodes 14 and 16 are inconspicuous and unlikely to degrade the display quality level of the display device 18.

Figure 4:
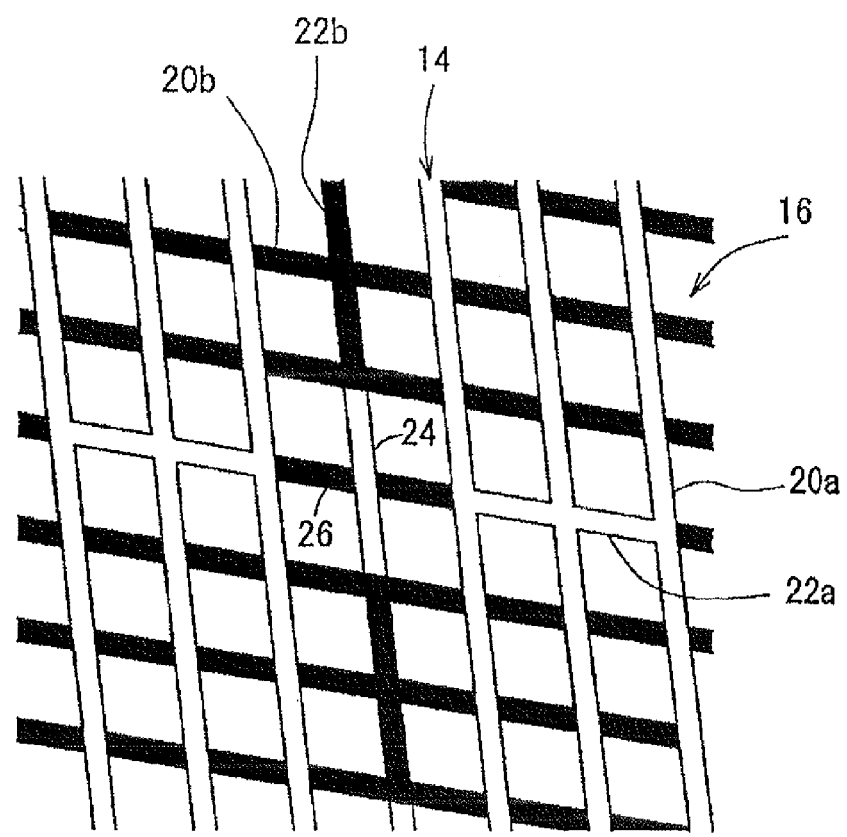
FIG. 4 is a partially enlarged view of FIG. 3.

Note that rhombuses as shown in FIG. 4 are formed by the first electrodes 14 and the second electrodes 16. In the present description, the grid pattern forms rhombuses rather than squares. The angle of the curves of the long lines 20a and 20b is suitably selected according to the size of the display device 18 and the like. Because of the curves, the conductor lines are not formed in the same direction as the black matrix. Consequently, first auxiliary lines 24 and second auxiliary lines 26, which are described below, are also disposed inclined with respect to the black matrix.

Further, because of the mesh pattern, even if one of the long lines 20a and 20b or one of the short lines 22a and 22b is cut during manufacturing, electrical signals can be applied by another one of the long lines 20a and 20b or another one of the short lines 22a and 22b, thus preventing a reduction in the manufacturing yield. The volume resistivity of the electrodes constituting the first electrodes 14 and the second electrodes 16 is 0.5×10−5 to 5×10−5 Ω·cm, which is lower than that of ITO. Further, the volume resistivity, line width, and height are adjusted in such a manner that the resistance between terminals of electrodes 16x and 14y is 5 kΩ or less, preferably 1 kΩ or less.

The short lines 22a and 22b are arranged at greater intervals than the long lines 20a and 20b, and each second electrode 16 is arranged between the adjacent short lines 22a of the first electrodes 14. Further, each first electrode 14 is arranged between the adjacent short lines 22b of the second electrodes 16. The conductor lines such as the short lines 22a of the first electrodes 14 and the long lines 20b of the second electrodes 16 are arranged at equal intervals. The conductor lines such as the short lines 20a of the first electrodes 14 and the long lines 22b of the second electrodes 16 are arranged at equal intervals. The short lines 22a of the first electrodes 14 do not overlap with the second electrodes 16, thereby preventing the occurrence of a moiré pattern. Also, the short lines 22b of the second electrodes 16 do not overlap with the first electrodes 14, thereby preventing the occurrence of a moiré pattern.

The first electrodes 14 and the second electrodes 16 are printed with ink containing conductive nanoparticles. The conductive nanoparticles include silver, gold, platinum, palladium, copper, carbon, or mixtures thereof. The average particle size of the nanoparticles is 2 μm or smaller, preferably in a range of 200 to 500 nm. The particle size thereof is smaller than that of known micron particles. Even if the line width of the electrodes 14 and 16 is 100 μm or less, the electrodes 14 and 16 having conductivity can be formed because the particle size of the nanoparticles is sufficiently smaller than the line width of the electrodes 14 and 16. Polyester resin and the like are used as the binders of the ink. The amount of the binder used is 1 to 20 weight parts, preferably 3 to 10 weight parts, per 100 weight parts of the conductive nanoparticles. A preferable solvent of the ink is one that adequately disperses conductive nanoparticles and has a boiling point of about 100° C. to 300° C. An example thereof is toluene having a boiling point of 110° C. Because the boiling point of the solvent is relatively low, the substrate 12 can be fired at a relatively low temperature after the ink is printed on the substrate 12, thereby reducing the thermal load on the substrate. The ink has been subject to dispersion treatment for nanoparticles. Material of the electrodes 14 and 16 do not include ITO containing indium, which is a rare element. Accordingly, it is possible to lower the cost of the electrode materials.

The present invention includes the multiple first auxiliary lines 24 and the multiple second auxiliary lines 26. The first auxiliary lines 24 are formed on the one side of the substrate 12, and the second auxiliary lines 26 are formed on the other side of the substrate 12. Each first auxiliary line 24 is formed between the adjacent first electrodes 14, and each second auxiliary line 26 is formed between the adjacent second electrodes 16. Materials of the first auxiliary lines 24 and the second auxiliary lines 26 are the same as those of the first electrodes 14 and the like. The first auxiliary lines 24 and the second auxiliary lines 26 are not connected to either first electrodes 14 or second electrodes 16.

FIG. 4 shows an enlarged view of the electrodes 14 and 16, and the auxiliary lines 24 and 26. The white solid lines are the first electrodes 14 and the first auxiliary lines 24 formed on the one side of the substrate 12, and the black solid lines are the second electrodes 16 and the second auxiliary lines 26 formed on the other side of the substrate 12. The first auxiliary lines 24 are oriented in the same direction as the short lines 22b of the second electrodes 16, and the length of the first auxiliary line 24 is equal to an interval d2 between the adjacent second electrodes 16. Further, the second auxiliary lines 26 are oriented in the same direction as the short lines 20a of the second electrodes 14, and the length of the second auxiliary lines 26 is equal to an interval d1 between the adjacent first electrodes 14. Each first auxiliary line 24 and each second auxiliary line 26 mutually intersect at their centers.

When the touch switch 10 is viewed from above or below, the first auxiliary lines 24 form continuous lines with the short lines 22b of the second electrodes 16. The first auxiliary lines 24 are formed on the one side of the substrate 12, and the short line 22b of the second electrodes 16 are formed on the other side thereof. Therefore, these lines are not actually in contact with each other; they are, however, arranged to form seemingly continuous lines. Likewise, the second auxiliary lines 26 and the short line 22a of the first electrodes 14 are also arranged to form continuous lines. Further, the long lines 20a of the first electrodes 14, the first auxiliary lines 24, and the short lines 22b of the second electrodes 16 are arranged at equal intervals. The long lines 20b of the second electrodes 16, the second auxiliary lines 26, and the short lines 22a of the first electrodes 14 are arranged at equal intervals. The equally spaced arrangement of these lines results in the formation of a grid with the first electrodes 14 and the like. As described above, these lines are seemingly continuous lines with curves at certain positions, and can form a grid pattern with the electrodes 14 and 16. One grid pattern is formed with the first electrodes 14 and the second electrodes 16 formed on two separate sides; it is not the case that two grid patterns are overlapped with each other to seemingly form one grid pattern. When two grid patterns are overlapped with each other, even a slight displacement causes a moiré pattern to appear; however, the present invention can prevent the occurrence of such a moiré pattern.

As described above, the seemingly connected lines are formed, and these lines are arranged at equal intervals. As a result, the conductor lines in a grid pattern are formed in the touch switch 10 as shown in FIG. 3. A grid pattern is formed when the first electrodes 14 and the second electrodes 16 are overlapped with each other. In this point, the present invention is different from prior Patent Literature 2. Even if the positions of the first electrodes 14 and the like are somewhat dislocated, the grid pattern is only slightly deformed, and a moiré pattern does not easily occur. It is possible to improve the manufacturing yield, compared to the case where the electrodes disclosed in Patent Literature 2 are arranged on both sides of the substrate.

An acrylic transparent adhesive 28 is used to bond a cover film 30 to the one side of the substrate 12. The first electrodes 14 and the first auxiliary lines 24 are protected by the cover film 30. The one side of the substrate 12 may be coated with a transparent resin, rather than using the cover film 30. An acrylic transparent adhesive 32 is used to bond the other side of the substrate 12 to a front surface of the display device 18. The electrodes 14 and 16 have the terminals 14y and 16x at their ends, and lead wires (not shown) extend from the terminals 14y and 16x for connection. The lead wires are connected to a control circuit for detecting the voltage applied to the electrodes 14 and 16 and a touch position. A touch position is detected by applying a predetermined voltage to the electrodes 14 and 16, and detecting an electrical change that occurs when a finger is moved closer to the touch switch 10.

A method for manufacturing the touch switch 10 is described: (1) The above-described substrate 12 and ink are provided. The substrate 12 is cut as needed into a desired shape, and washed. (2) The first electrodes 14 and the first auxiliary lines 24 are formed by printing the ink on the one side of the substrate 12. (3) The second electrodes 16 and the second auxiliary lines 26 are formed by printing the ink on the other side of the substrate 12. (4) The acrylic transparent adhesive 28 is applied to the one side of the substrate 12, and the cover film 30 is then bonded to the one side of the substrate 12.

The printing in (2) and (3) is carried out by screen printing or ink-jet printing. The ink still has a high specific resistance and no conductivity after simply carrying out screen printing or ink-jet printing. Conductivity is imparted to the ink by firing the ink in a kiln after printing. The electrodes 14 and 16 can be very easily produced without the need for vacuum film formation and etching, which are required for the manufacturing of ITO.

Further, the lead wires are formed using silver ink and the like so as to extend from the end of each of the electrodes 14 and 16, and the electrodes 14 and 16 are connected to the control circuit of the touch switch via the lead wires. By forming the lead wires by screen printing and the like using the same ink used for the electrodes, it is possible to simultaneously form the lead wires and the electrodes 14 and 16.

The completed touch switch 10 is mounted to the front side of the display device 18 using the acrylic transparent adhesive 32 or the like. Alignment marks are provided, if necessary, to the corners of the substrate 12 and the display device 18 for positioning.

Next, a different type of touch switch is described. Descriptions of the same components as in the above-described touch switch may be omitted.

Figure 5:
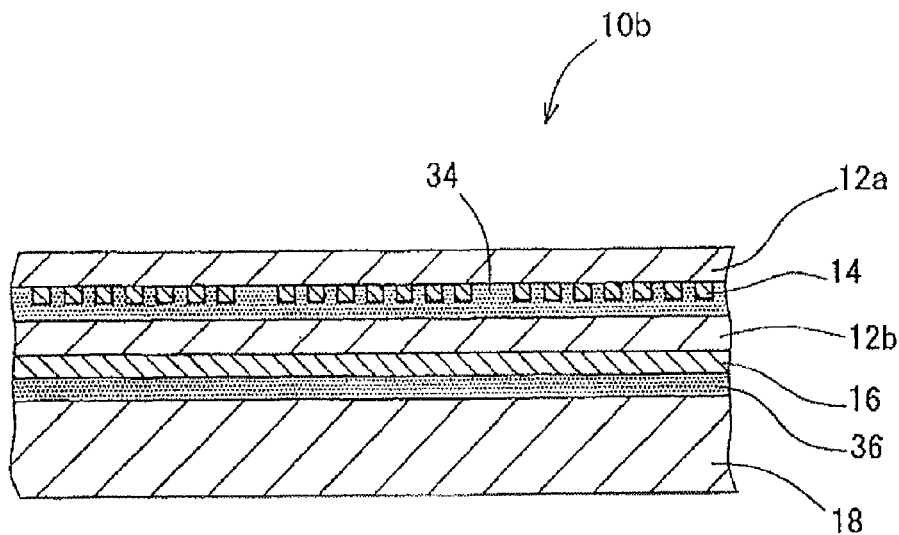
FIG. 5 shows a partial cross section of the touch switch.

A touch switch 10b shown in FIG. 5 includes a first substrate 12a, a second substrate 12b disposed facing the first substrate 12a, the multiple first electrodes 14 formed on a first side of the first substrate 12a, and the multiple second electrodes 16 formed on a first side of the second substrate 12b. The first side of the first substrate 12a faces a second side of the second substrate 12b. The first side of the second substrate 12b is a side mounted to the display device 18. The first electrodes 14 and the second electrodes 16 are the same as those shown in FIGS. 2 to 4. They are mesh-like electrodes formed by the long lines 20a and 20b, and the short lines 22a and 22b. Materials for the substrates 12a and 12b and the electrodes 14 and 16 are the same as those for the touch switch 10.

The first auxiliary lines 24 are formed on the first side of the first substrate 12a, and the second auxiliary lines 26 are formed on the first side of the second substrate 12b. Each first auxiliary line 24 is formed between the adjacent first electrodes 14, and each second auxiliary line 26 is formed between the adjacent second electrodes 16. The first auxiliary lines 24 are oriented in the same direction as the short lines 22b of the second electrodes 16, and the length of each first auxiliary line 24 is equal to an interval d2 between the adjacent second electrodes 16. Further, the second auxiliary lines 26 are oriented in the same direction as the short lines 22a of the second electrodes 14, and the length of each second auxiliary line 26 is equal to an interval d1 between the adjacent first electrodes 14. Materials for the first auxiliary lines 24 and the second auxiliary lines 26 are the same as those for the first electrodes 14 and the like.

As with the above-described touch switch 10, the first auxiliary lines 24 form continuous lines with the short lines 22b of the second electrodes 16. These lines are not in contact with each other; they are, however, arranged to form seemingly continuous lines. Likewise, the second auxiliary lines 26 and the short lines 20a of the first electrodes 14 are also arranged to form continuous lines.

As shown in FIG. 5, the first substrate 12a and the second substrate 12b are bonded to each other using a transparent acrylic transparent adhesive 34 or the like. The second substrate 12b and the second electrodes 16 are bonded to the display device 18 using a transparent acrylic transparent adhesive 36 or the like.

Additionally, lead wires (not shown) are connected to the terminals 14y and 16x of the electrodes 14 and 16. The lead wires are connected to a control circuit that detects the voltage applied to the electrodes 14 and 16, and a touch position. A touch position is detected by applying a predetermined voltage to the electrodes 14 and 16, and detecting an electrical change that occurs when a finger is moved closer to the touch switch 10b.

A method for manufacturing the touch switch 10b is described: (1) The above-described substrate 12 and ink are provided. The substrates 12a and 12b are cut as needed into a desired shape, and washed. (2) The first electrodes 14 and the first auxiliary lines 24 are formed by printing the ink on the first side of the substrate 12a. (3) The second electrodes 16 and the second auxiliary lines 26 are formed by printing the ink on the first side of the second substrate 12b. (4) The first substrate 12a and the second substrate 12b are bonded to each other using the acrylic transparent adhesive 34, in such a manner that the second side of the second substrate 12b is disposed facing the first side of the first substrate 12a.

The printing in (2) and (3) is carried out by screen printing or ink-jet printing. The printing can be performed very easily. Conductivity is imparted to the ink by firing the ink in a kiln after printing. The completed touch switch 10b is mounted to the front side of the display device 18 using the acrylic transparent adhesive 36 or the like.

As described above, the touch switches 10 and 10b of the present invention have the auxiliary lines 24 each formed between the adjacent electrodes 14, and the auxiliary lines 26 each formed between the adjacent electrodes 16. A grid pattern with equal intervals is formed by these electrodes 14 and the like, and a moiré pattern does not easily occur. Further, a grid pattern of electrodes is not formed only on one side of the substrate, as in Patent Literature 2, but is formed using both sides of the substrate. A moiré pattern does not easily occur even if the positional accuracy of the electrodes 14 and the like is decreased, and the manufacturing yield can be improved.

Figure 6:
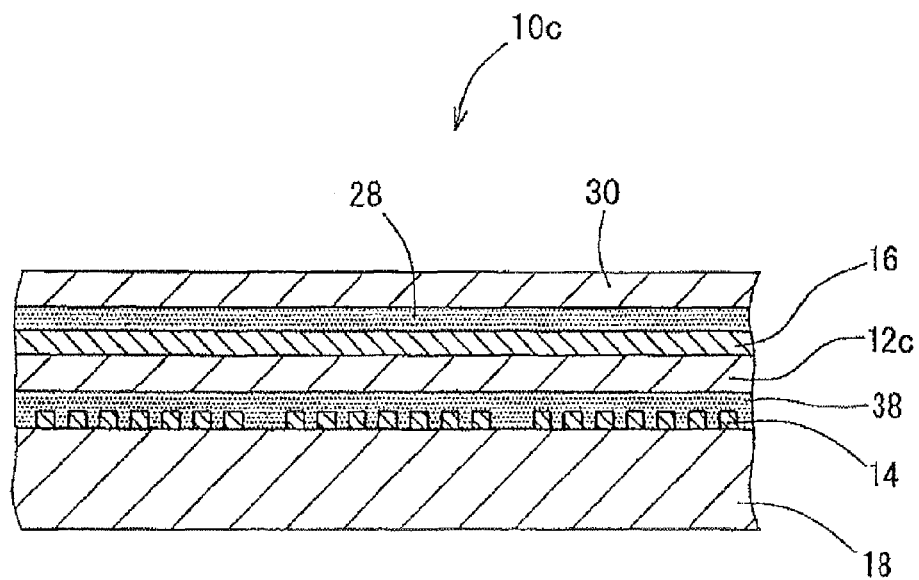
FIG. 6 shows a partial cross section of the touch switch.

An embodiment of the present invention is described above; however, the embodiment of the present invention is not limited to the above-described embodiment. For example, the first electrodes 14 and the first auxiliary lines 24 may be formed on the surface of the display device 18, viewing the display device 18 as the first substrate (FIG. 6). The second electrodes 16 and the second auxiliary lines 26 are formed on one side of a second substrate 12c, and the other side of the second substrate 12c is bonded to the display device 18 using an acrylic transparent adhesive 38. The cover film 30 is bonded to the one side of the second substrate 12c using the acrylic transparent adhesive 28, thereby protecting the second electrodes 16 and the second auxiliary lines 26. The first electrodes 14, the first auxiliary lines 24, the second electrodes 16, the second auxiliary lines 26, the second substrate 12c, and the like have the same structures as those in the above-described embodiment.

Figure 7:
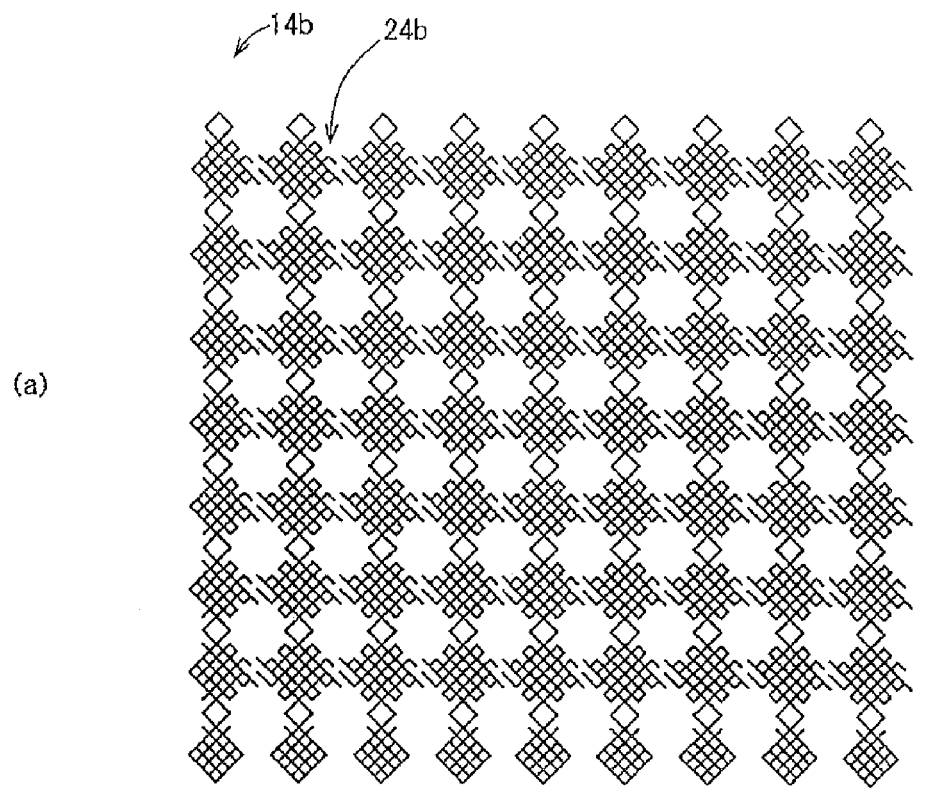
FIG. 7 shows electrodes and auxiliary lines of the touch switch.
Figure 7:
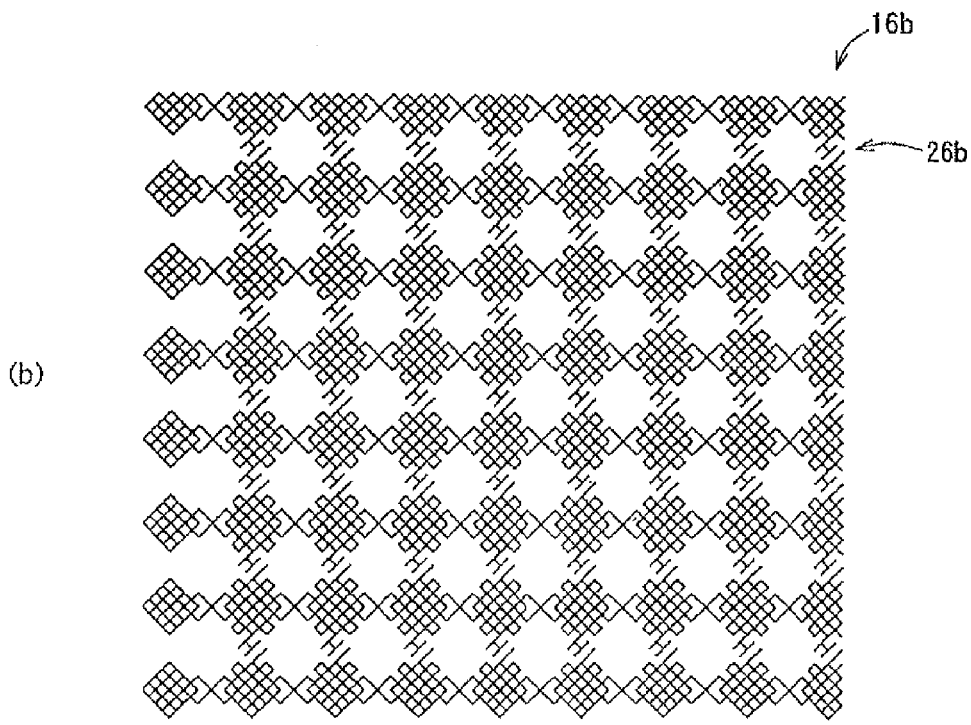
Figure 8:
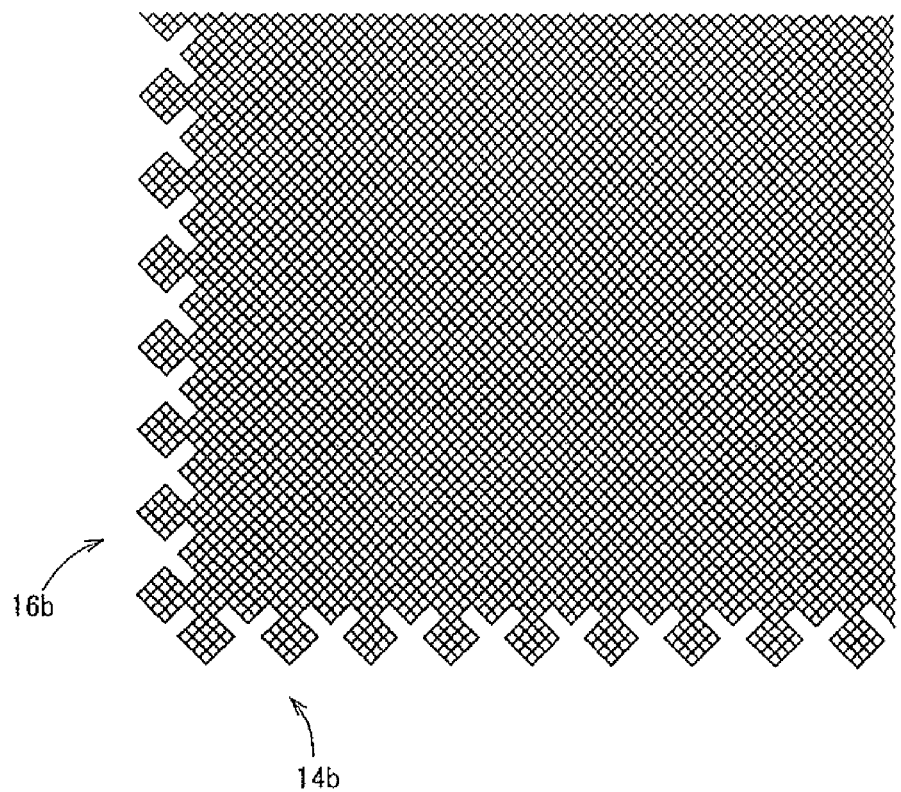
FIG. 8 shows a positional relationship of the first electrodes, the first auxiliary lines, the second electrodes, and the second auxiliary lines of FIG. 7.

First, electrodes 14b and second electrodes 16b, in which multiple meshes are put together, as shown in FIGS. 7(a) and (b), may be used. The first electrodes 14b and the second electrodes 16b are arranged at equal intervals. Each first auxiliary line 24b is provided and connected between the adjacent first electrodes 14b. Each second auxiliary line 26b is provided and connected between the adjacent second electrodes 16b. The first electrodes 14b and the second electrodes 16b are respectively disposed on the one side and the other side of the substrate 12 of FIG. 1, or are respectively disposed on the first substrate 12a and the second substrate 12b of FIG. 5. When the first and second electrodes are overlapped with each other in the same manner as described above, a grid pattern as shown in FIG. 8 is formed. In the same manner as shown in FIG. 2, the electrodes 16x and the electrodes 14y (not shown) are directly or indirectly connected to the ends of the first electrodes 14b and the ends of the second electrodes 16b, respectively. As shown in FIGS. 7 and 8, when a grid pattern is formed and the lines forming the grid pattern are inclined with respect to the black matrix, a moiré pattern does not easily occur.

In the case as shown in FIG. 8, the conductor lines and the auxiliary lines are inclined at 45 degrees with respect to the black matrix. However, depending on the display device, there are cases where a moiré pattern occurs when the lines are inclined at 45 degrees. Therefore, the angle of inclination is adjusted to an angle at which a moiré pattern does not easily occur, according to the display device that is actually used.

The structures of the electrodes 14 and 16 and the auxiliary lines 24 and 26 described in FIG. 2 and the like are merely examples. The important points are: (1) the conductor lines and the like are inclined with respect to the black matrix in the display device; (2) a grid pattern is formed using the substrate 12, with the conductor lines and the like formed on both sides of one substrate 12, or on the two substrates 12a and 12b; and (3) the conductor lines and the like may intersect each other when a grid pattern is formed, but they do not overlap each other.

Figure 9:
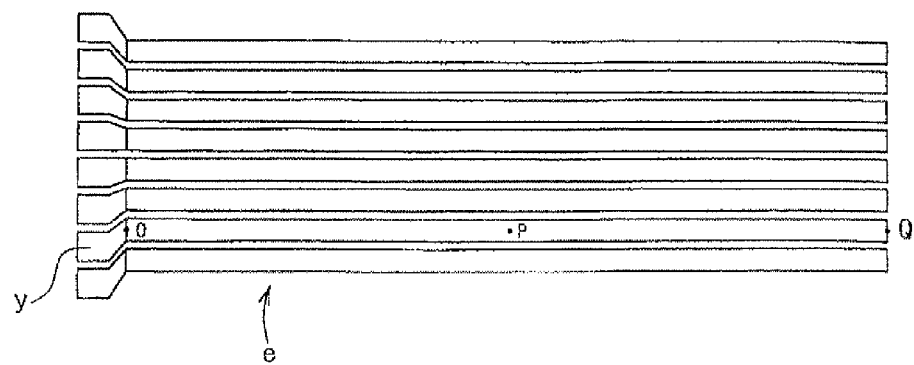
FIG. 9 shows electrodes used for comparison between mesh-like electrodes and ITO electrodes.

In order to confirm the effect of the present invention, electrodes e shown in FIG. 9 were formed with ITO as well as with mesh-like silver electrodes. Each electrode e has a width of 3 mm and a length of 30 cm. In the case of the ITO, the resistance between the patterns of the electrodes e was about 30 kΩ. In the case of the silver electrodes, the resistance was about 52Ω. A comparison of the sensitivity was performed using the seventh electrode e from the top. A predetermined voltage was applied from a terminal y at the left end of the electrode e, and a change in the capacitance was also detected from the terminal y. The sensitivity was substantially the same at point O, which is 0 cm from the terminal y. The sensitivity of the ITO electrode was ⅓ that of the mesh-like silver electrode at point P, which is 15 cm away from the terminal y; and ⅕ at point Q, which is 30 cm away from the terminal y. In the case of the mesh-like silver electrode, a change in the sensitivity from points O to Q was very small. In the case of the ITO electrode, the sensitivity was very small at points P (15 cm) and Q (30 cm). This shows that the size of the touch switch of the present invention can be easily enlarged, compared to the case where the ITO electrode is used.

The present invention can be practiced in embodiments to which various improvements, modifications, and changes are added based on the knowledge of a person skilled in the art, without departing from the scope of the invention.

Second Embodiment

Hereinbelow, a second embodiment of the present invention is described with reference to the attached drawings. Note that none of the drawings reflects the actual size. They are partially enlarged or reduced in order to facilitate the understanding of the structures.

Figure 10:
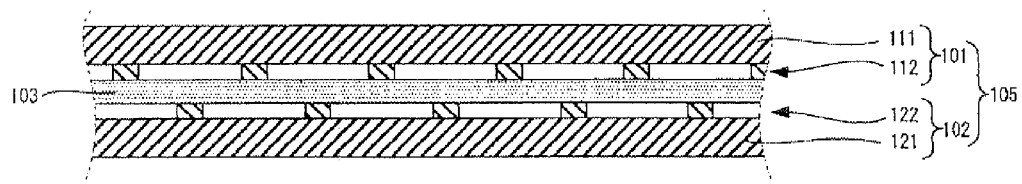
FIG. 10 is a schematic cross-sectional diagram of the main components of a touch switch according to a second embodiment of the present invention.
Figure 11:
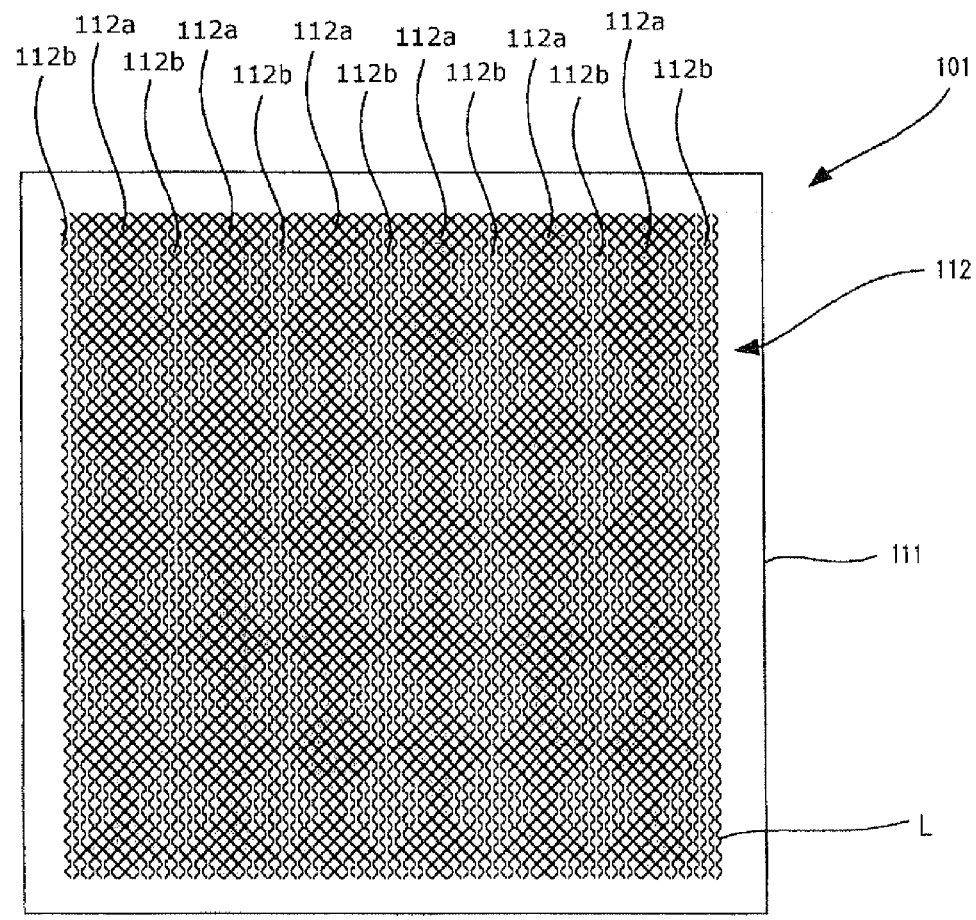
FIG. 11 is a plan view of a first planar body included in the touch switch shown in FIG. 10.
Figure 12:
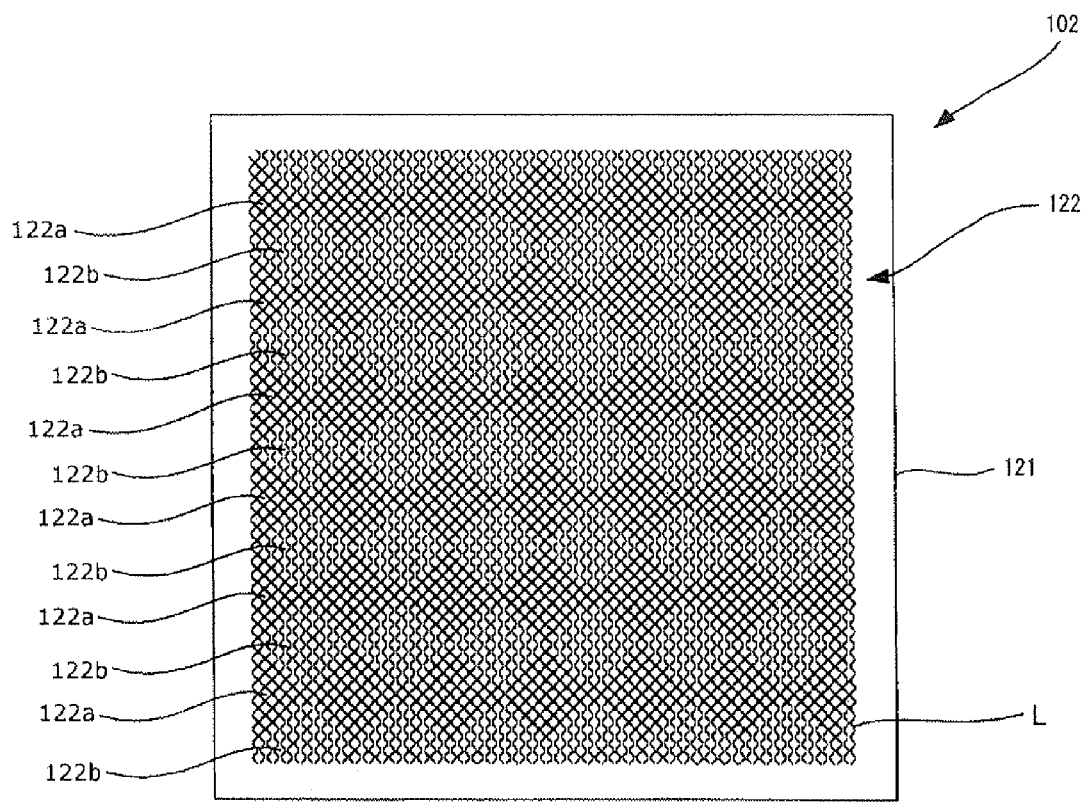
FIG. 12 is a plan view of a second planar body included in the touch switch shown in FIG. 10.

FIG. 10 is an enlarged schematic cross-sectional diagram of the main components of a touch switch according to a second embodiment of the present invention. This touch switch 105 is a capacitive touch switch, and includes, as shown in FIGS. 11 and 12, a first planar body 101 in which a mesh-like electrode 112 is formed on one side of a substrate 111, and a second planar body 102 in which a mesh-like electrode 122 is formed on one side of a substrate 121. Note that FIG. 11 is a plan view of the first planar body 101, and FIG. 12 is a plan view of the second planar body 102. The first planar body 101 and the second planar body 102 are integrally bonded via an adhesive layer 103 in such a manner that the mesh-like electrodes 112 and 122 on their respective planar bodies face each other. Note that the first planar body 101 and the second planar body 102 are bonded in such a manner that conductive areas 112a of the first planar body 101 and conductive areas 122a of the second planar body 102, which are described below, perpendicularly intersect each other.

The substrates 111 and 121 are dielectric substrates. Examples of materials of the substrates 111 and 121 include transparent materials such as glass, polyester, polyethylene terephthalate, polycarbonate, polymethylmethacrylate, polyethylene naphthalate, etc. In the case of glass, the thickness is preferably about 0.1 to 3 mm; in the case of plastic film, the thickness is preferably about 10 to 2,000 μm. These materials may also be laminated in multiple layers.

Figure 13:
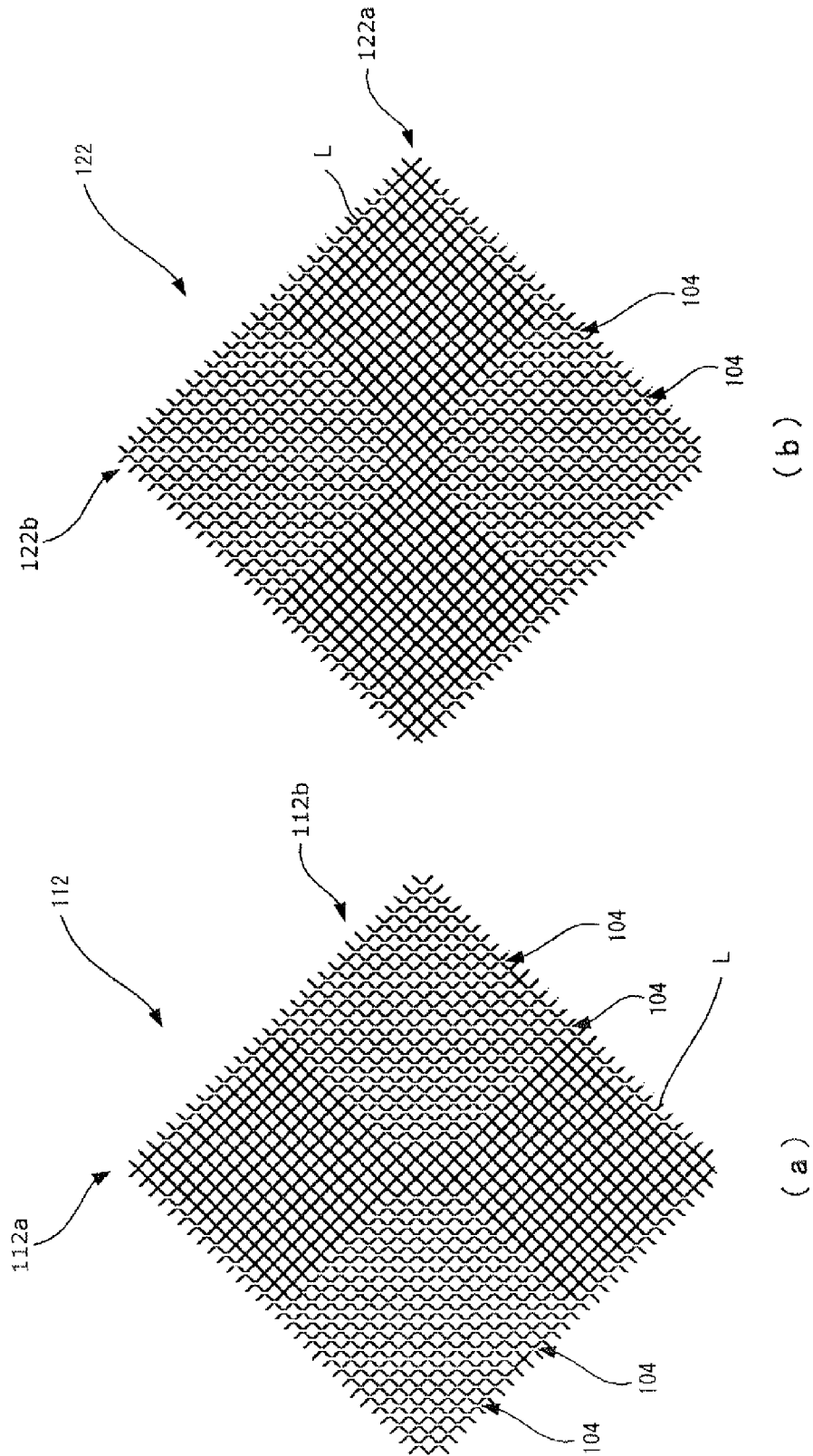
FIG. 13(a) is an enlarged view of the main parts of FIG. 11.
FIG. 13(b) is an enlarged view of the main parts of FIG. 12.

As shown in FIGS. 11 and 12, and their enlarged views FIGS. 13(a) and 13(b) (showing the main parts), the mesh-like electrodes 112 and 122 respectively formed on one side of the first planar body 101 and on one side of the second planar body 102 are electrodes formed in a mesh pattern with multiple conductor lines L.

Figure 14:
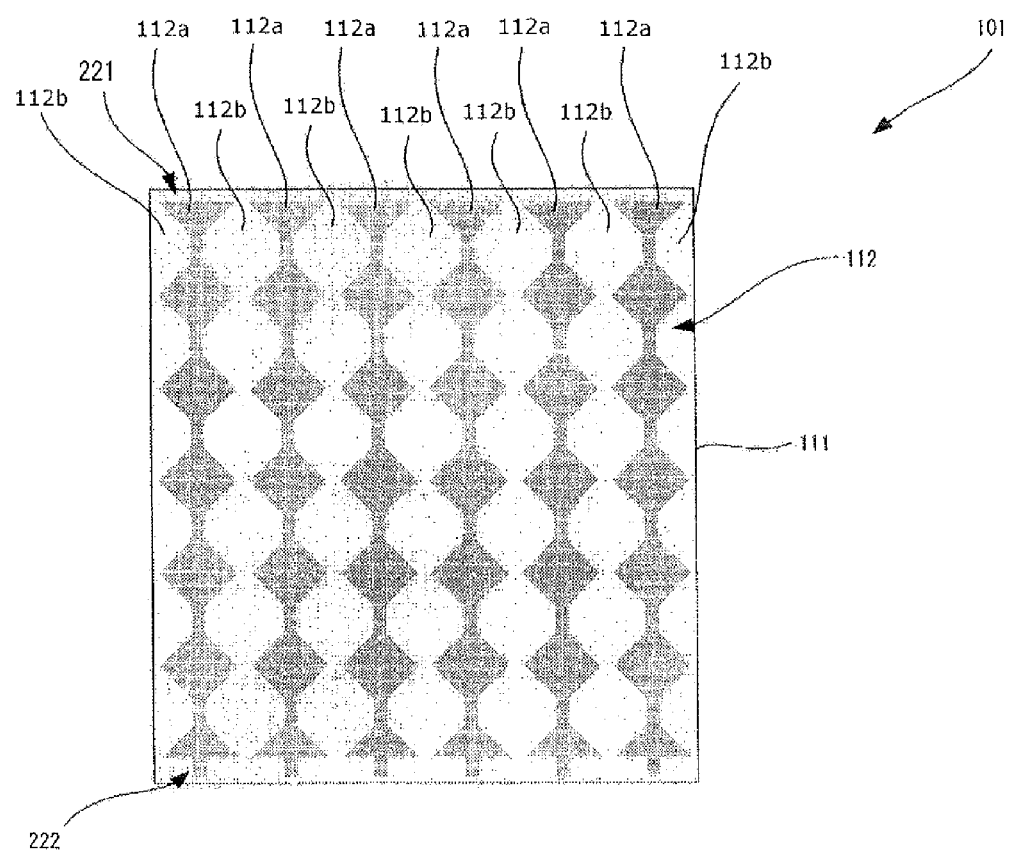
FIG. 14 is a diagram showing boundaries between conductive areas and non-conductive areas of a mesh-like electrode of the first planar body shown in FIG. 11.
Figure 15:
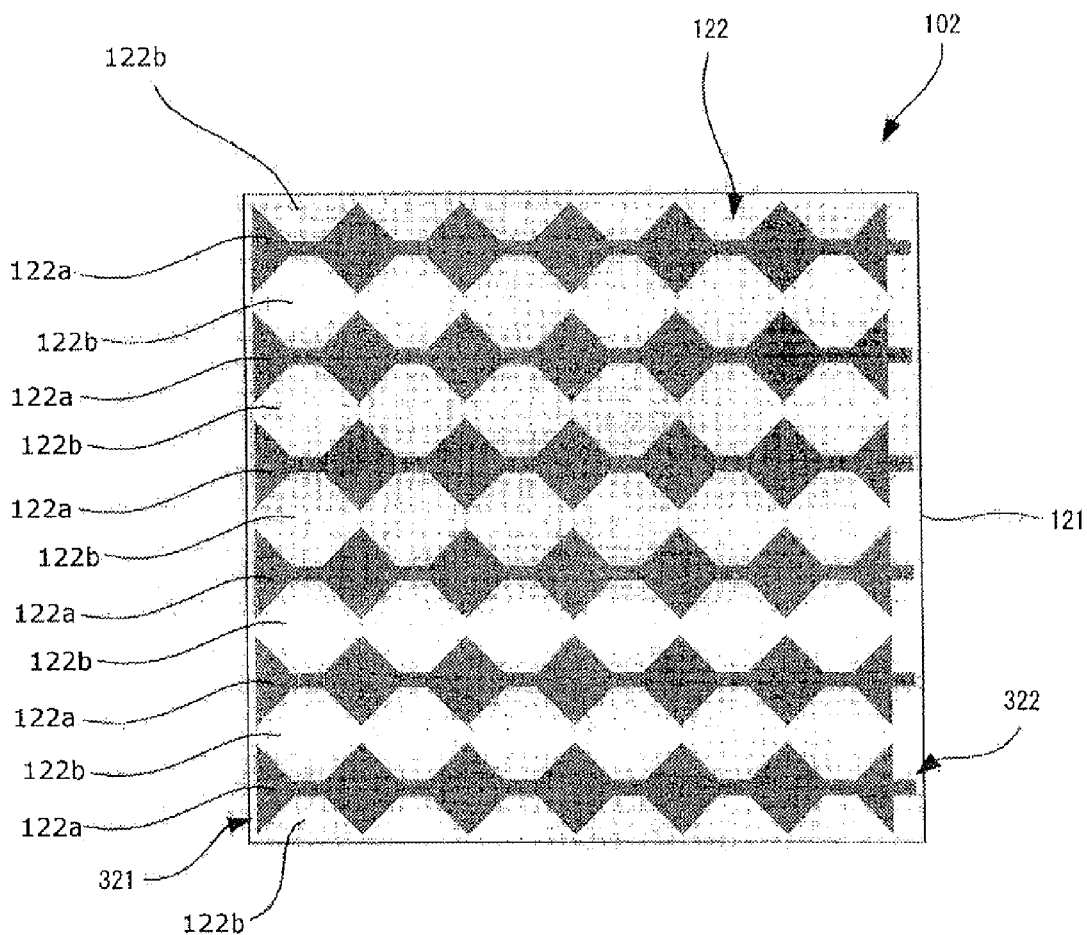
FIG. 15 is a diagram showing boundaries between conductive areas and non-conductive areas of a mesh-like electrode of the second planar body shown in FIG. 12.

Further, the mesh-like electrode 112 (122) is separated into the multiple conductive areas 112a (122a) disposed substantially parallel to each other at predetermined intervals, and non-conductive areas 112b (122b) each disposed between the adjacent conductive areas. FIG. 14 is a diagram showing boundaries between the conductive areas 112a and the non-conductive areas 112b of FIG. 11. FIG. 15 is a diagram showing boundaries between the conductive areas 122a and the non-conductive areas 122b of FIG. 12. In both drawings, the gray colored portion represents the conductive areas 112a and 122a. The conductive areas 112a and 122a are connected to an outside drive circuit (not shown) via a routed circuit (not shown) formed of conductive ink, etc.

Further, each non-conductive area 112b (122b) includes multiple cutting portions 104 that cut the conductor lines L into island-like forms. Each non-conductive area 112b (122b) insulates between the adjacent conductive areas by the cutting portions 104. In the present embodiment, the cutting portions 104 are formed at intersections of the multiple conductor lines L that form the mesh-like electrodes 112 and 122. The cutting width of the cutting portions 104 is, for example, about the same as the line width of the conductor lines L, or about a few times greater than the line width of the conductor lines L.

As described above, the non-conductive areas 112b and 122b have the cutting portions 104 that cut the conductor lines L. This structure can ensure insulation in the non-conductive areas 112b and 122b of the mesh-like electrodes 112 and 122. Accordingly, when the touch switch 105 is formed by overlapping the first planar body 101 and the second planar body 102, the non-conductive areas 112b (122b) of the mesh-like electrode 112 (122) of the first planar body 101 (the second planar body 102) is prevented from adversely affecting the sensing of the mesh-like electrode 122 (112) of the other planar body, and thus the detection of capacitance can be stably performed.

The line width of the conductor lines L is, for example, 10 to 30 μm. The pitch of the conductor lines L is 100 to 1,000 μm. The thickness of the conductor lines L is usually about 1 to 30 μm. In view of the improvement of the visibility by allowing the shape of the pattern of the mesh-like electrodes 112 and 122 to be inconspicuous, the conductor lines L are preferably as thin as possible. However, when the conductor lines L are too thin, it is difficult to ensure the durability and weather resistance necessary for the mesh-like electrodes 112 and 122. Accordingly, the thickness is preferably about 10 to 30 μm. The mesh-like electrodes 112 and 122 having the above-described dimensions are inconspicuous because the line width of the conductor lines L is very thin, and the pitch is sufficiently large relative to the line width.

Examples of methods for forming the conductor lines L that form the mesh-like electrodes 112 and 122 include: (i) a method in which a conductive paste containing ultrafine conductive particles is screen-printed on a transparent substrate (see Japanese Unexamined Patent Publication No. 2007-142334, and the like); and (ii) a method in which metal foil such as copper or the like is laminated on a transparent substrate, a resist pattern is formed on the metal foil, and the metal foil is etched (see Japanese Unexamined Patent Publication No. 2008-32884, and the like).

The methods for forming the conductor lines L are not limited to the above described formation methods (i) and (ii). Printing methods other than the method (i), such as gravure printing, or photolithography other than the method (ii) may be used.

Figure 16:
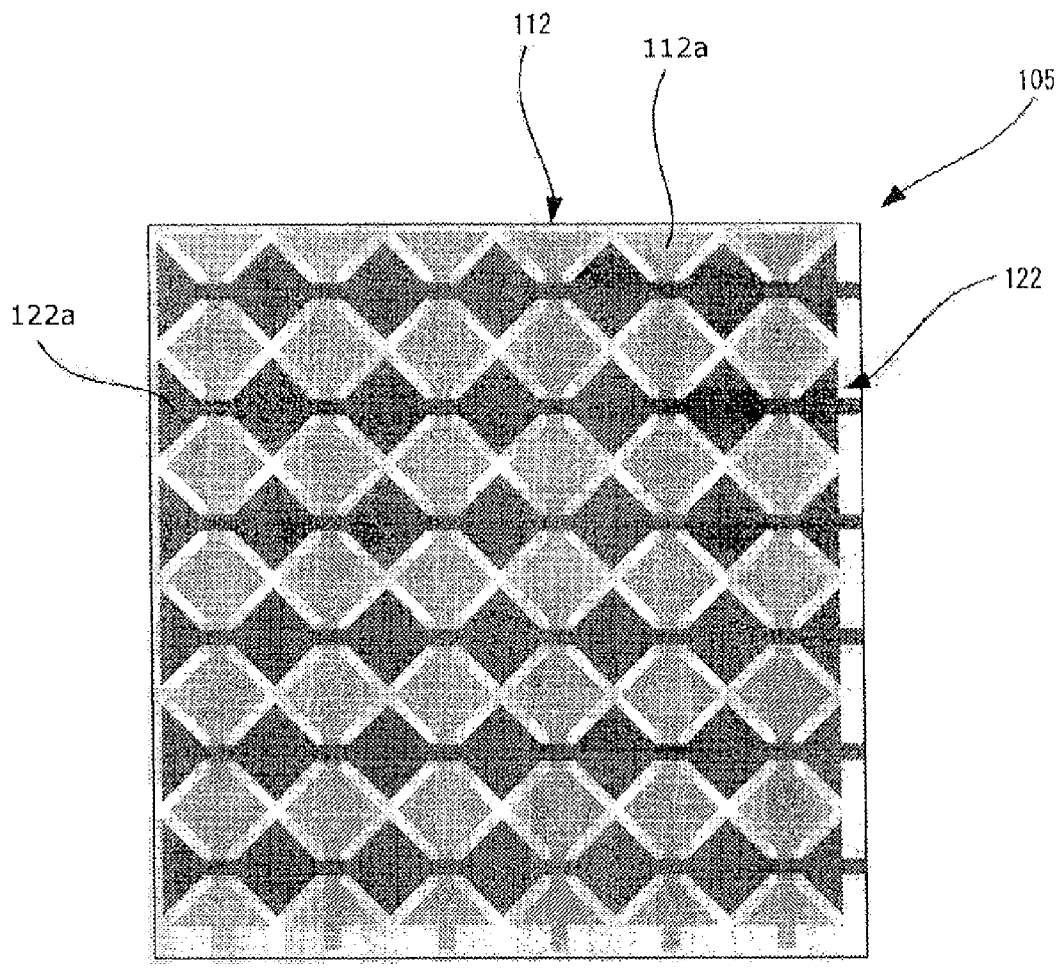
FIG. 16 is a plan view of a touch switch according to an embodiment of the present invention.

As shown in FIGS. 11 to 15, the shape of the conductive areas 112a and 122a in the mesh-like electrodes 112 and 122 is formed from linearly connected multiple rhombuses. The rhombic conductive areas of each conductive area 112a and the rhombic conductive areas of each conductive area 122a are connected in the directions in which they intersect each other; and, as shown in FIG. 16, they are arranged in such a manner that the rhombuses of the conductive areas 112a and the rhombuses of the conductive areas 122a, which are arranged at the upper and lower sides, do not overlap each other when the first planar body 101 and the second planar body 102 are overlapped with each other. Note that the shape of the conductive areas 112a and 122a can be any shape, such as a linear shape, etc., insofar as the contact point of the finger or the like can be detected.

The first planar body 101 and the second planar body 102 are preferably bonded to each other with the adhesive layer 103 entirely interposed therebetween so as to avoid formation of an air layer. Epoxy-based, acryl-based and like generally used transparent adhesives may be used as the adhesive layer 103, and they may include a core material formed from a transparent film of norbornene-based resin. The thickness of the adhesive layer 103 is, for example, preferably 500 μm or less. The adhesive layer 103 may also be formed by overlapping multiple sheet-like adhesives, or by overlapping several different types of sheet-like adhesives.

Figure 17:
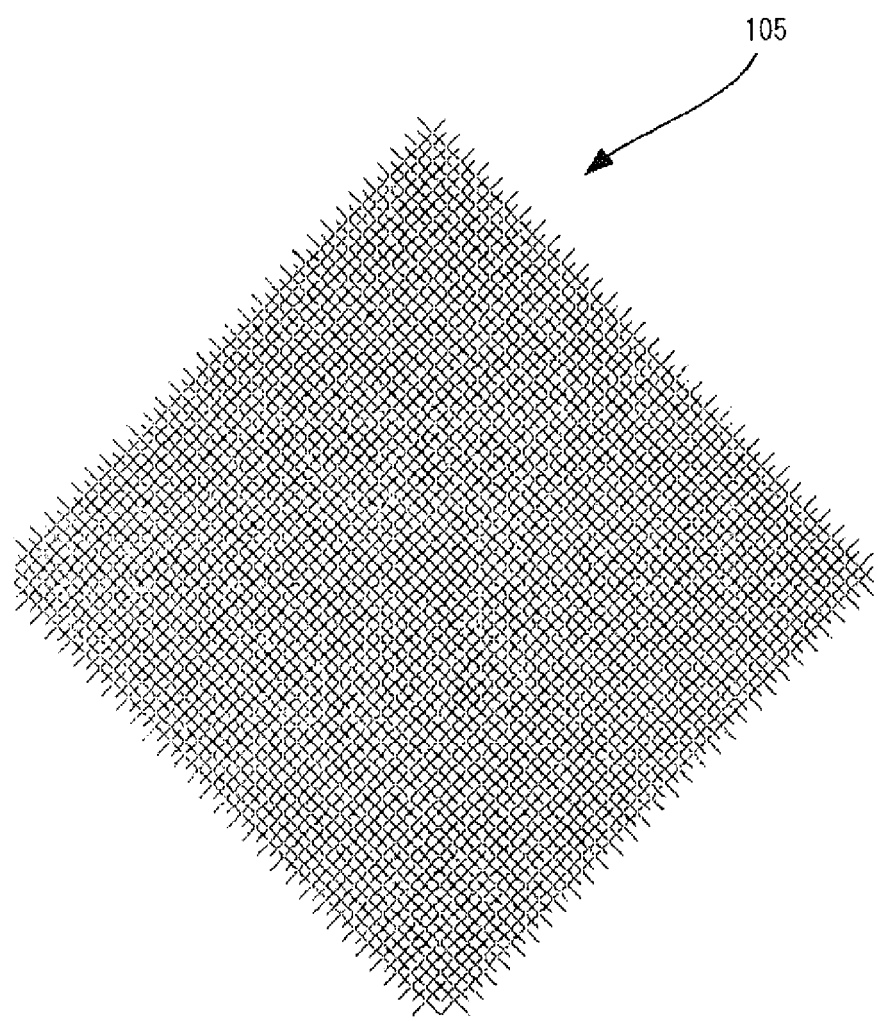
FIG. 17 is a plan view showing a form in which the first planar body and the second planar body are bonded to each other.

Further, particularly preferably, a mesh pattern with an entirely uniform appearance is obtained as shown in FIG. 17 when the first planar body 101 and the second planar body 102 are bonded to each other in such a manner, for example, that the vertex of each mesh of the mesh-like electrode 122 on the second planar body 102 is positioned at the center of each mesh of the mesh-like electrode 112 on the first planar body 101, and the conductor lines L forming the meshes of the mesh-like electrode 112 intersect the conductor lines L forming the meshes of the mesh-like electrode 122. Note that FIG. 17 is a view showing the electrodes of FIGS. 13(a) and 13(b) bonded to each other.

The touch switch 105 formed by bonding the first planar body 101 and the second planar body 102 to each other is used by being mounted, for example, to a display device in which a black matrix is formed. Preferably, the touch switch 105 is mounted to the display device in such a manner that the mesh patterns of the conductive areas 112a and 122a and the non-conductive areas 112b and 122b are inclined with respect to the black matrix, so as to avoid a moiré pattern that occurs when the black matrix and the mesh pattern are arranged in the same direction. The angle of inclination is suitably adjusted to an angle at which a moiré pattern does not easily occur, according to the display device that is actually used.

The method for detecting a touch position in the touch switch 105 having the above-described structure is the same as that in known capacitive touch switches. A change in the voltage based on the capacitance of a human body is detected at the contact position on the electrodes 112 and 122, and a coordinate of the contact position is thereby calculated.

The touch switch 105 according to the present embodiment includes the mesh-like electrodes 112 and 122 respectively formed on the first planar body 101 and the second planar body 102, in which the mesh-like electrode 112 (122) is separated into the strip-like conductive areas 112a (122a), and the strip-like non-conductive areas 112b (122b) having the multiple cutting portions 104 that intermittently cut the conductor lines L. Consequently, the touch switch 105 can effectively suppress the occurrence of variation in mesh density when the first planar body 101 and the second planar body 102 are overlapped with each other, while ensuring electrical insulation in the non-conductive areas 112b and 122b. Because the variation in mesh density can be suppressed, the shape of the pattern of the mesh-like electrodes 112 and 122 can be made inconspicuous, thus improving the visibility.

Further, the mesh-like electrodes 112 and 122 according to the present embodiment can be printed with ink containing conductive nanoparticles, using a mask having a predetermined mask pattern. Consequently, the first planar body 101 and the second planar body 102 can be efficiently manufactured.

An embodiment of the present invention is described above; however, the specific embodiment of the present invention is not limited to the above-described embodiment. For example, in the above-described embodiment, the cutting portions 104 formed in the non-conductive areas 112*b* and 122*b* respectively included in the mesh-like electrodes 112 and 122 are disposed at the intersections of the multiple conductor lines L; however, the cutting portions 104 may be disposed at any positions insofar as insulation in the non-conductive areas 112*b* and 122*b* is ensured, and the length of the cutting portions 104 may also be arbitrarily set.

Figure 18:
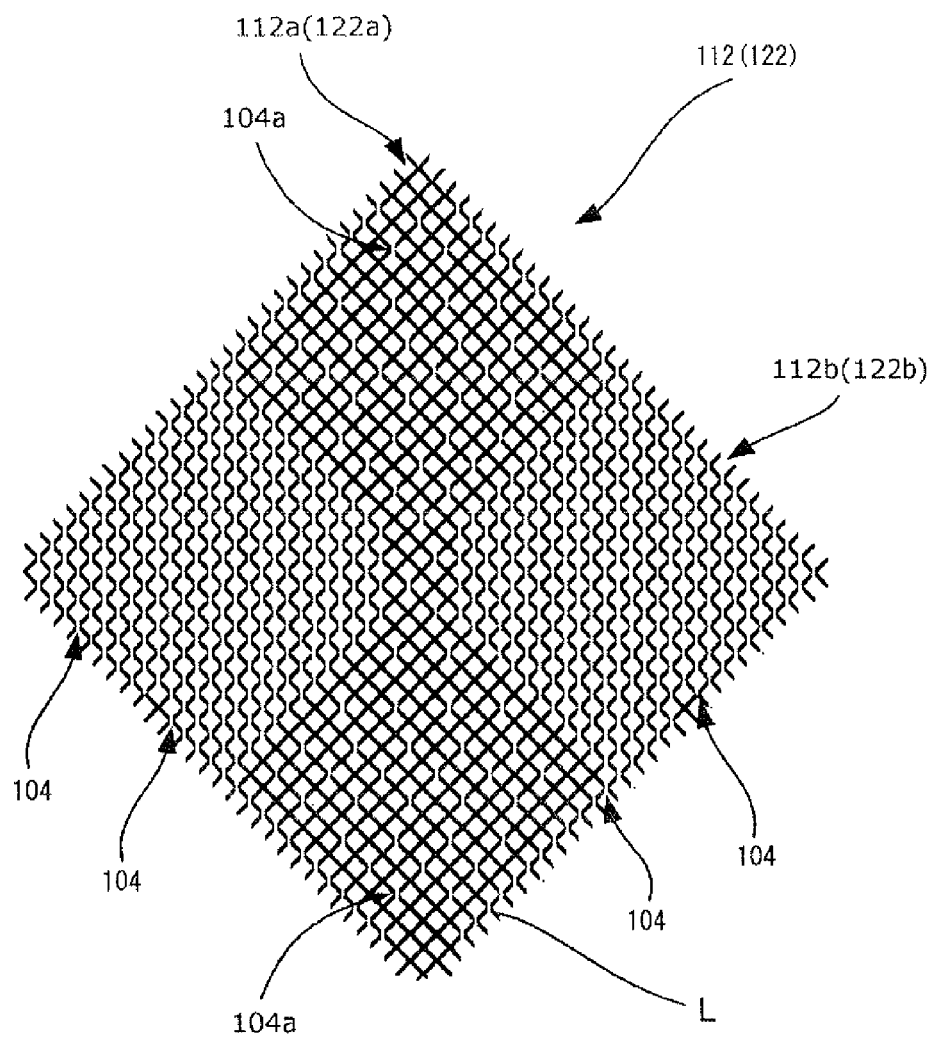
FIG. 18 is a plan view showing a modification of the planar body of the present invention.
Figure 19:
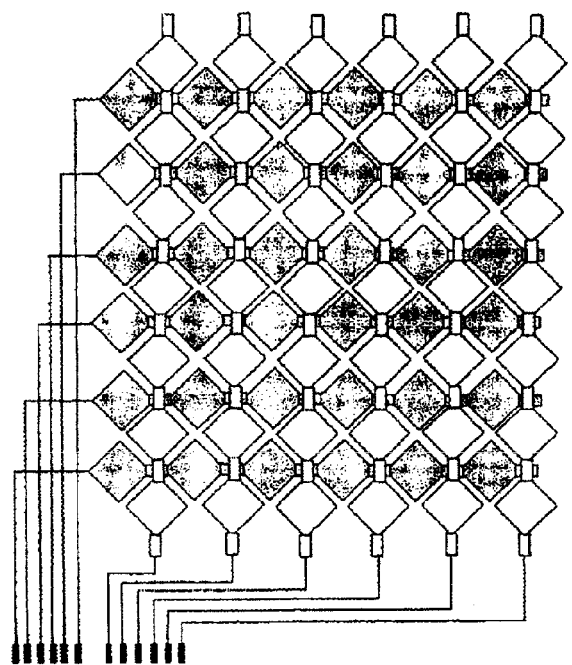
FIG. 19 is a plan view of a known capacitive touch switch having a matrix electrode.
Figure 20:
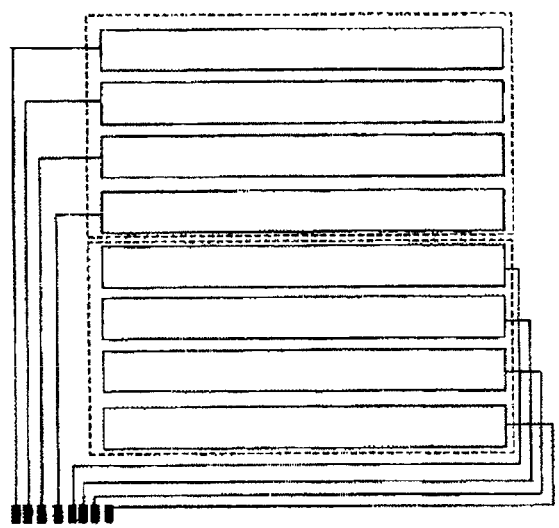
FIG. 20 is a plan view of a known capacitive touch switch having a matrix electrode.
Figure 21:
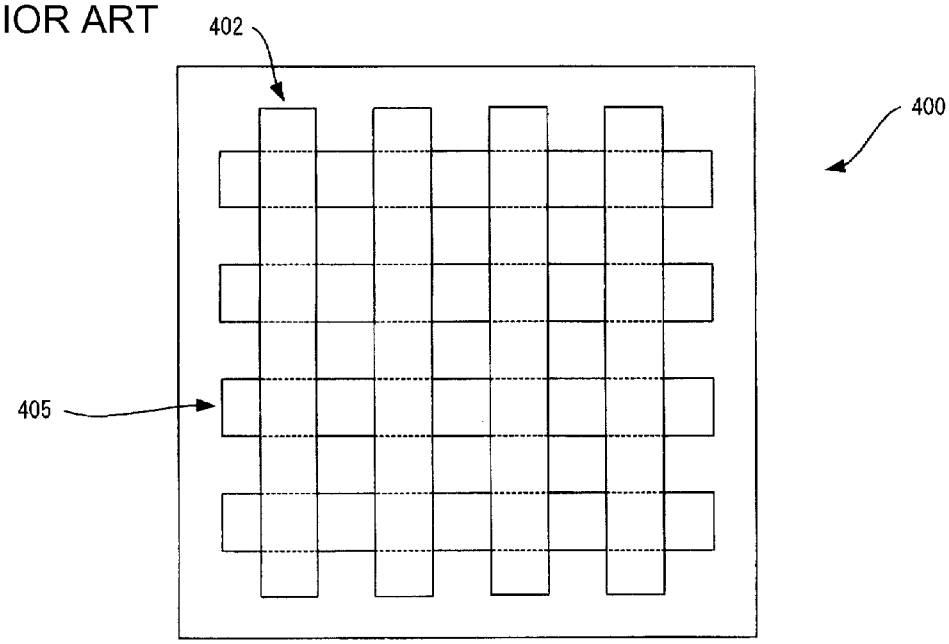
FIG. 21 is a schematic plan diagram schematically showing a known capacitive touch switch.
Figure 22:
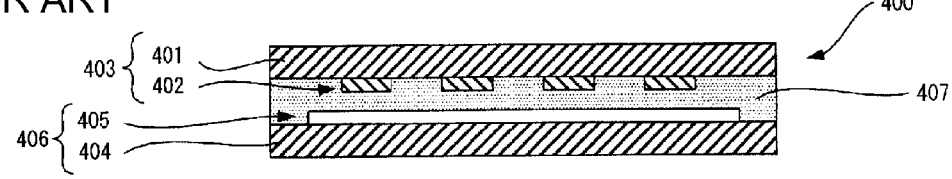
FIG. 22 is a cross-sectional view of FIG. 21.

Further, the above-described embodiment is formed in such a manner that the only non-conductive areas 112*b* and 122*b* have the cutting portions 104 that cut the conductor lines L; however, as shown in FIG. 18, the conductive areas 112*a* and 122*a* may be partially provided with cutting portions 104*a* that cut the conductor lines L insofar as they do not interfere with the conductivity between the ends 221 and 222 (321 and 322) of each conductive area 112*a* (122*a*). The visibility can be further improved by the above-described structure.

REFERENCE SINGS LIST 10, 10*b*, 10*c* Touch switches
12, 12*a*, 12*b*, 12*c* Substrates
14, 14*b*, 16, 16*b* Electrodes
18 Display device
20*a*, 20*b* Long lines (conductor lines)
22*a*, 22*b* Short lines (conductor lines)
24, 24*b*, 26, 26*b* Auxiliary lines
28, 32, 34, 36, 38 Acrylic transparent adhesives
30 Cover film
101 First planar body
111 Substrate
112 Mesh-like electrode
112*a* Conductive area
112*b* Non-conductive area
102 Second planar body
121 Substrate
122 Mesh-like electrode
122*a* Conductive area
122*b* Non-conductive area
103 Adhesive layer
104, 104*a* Cutting portions
105 Touch switch
L Conductor line

The invention claimed is:

1. A planar body, in a capacitive touch switch, comprising a mesh-like electrode formed on one side of a substrate by intersecting multiple conductor lines, wherein the mesh-like electrode is separated into multiple conductive areas aligned at certain intervals and multiple non-conductive areas each disposed between two adjacent conductive areas disposed at certain intervals, each non-conductive area is provided as an area in which insulation is ensured by forming multiple first cutting portions that cut the conductor lines on the conductor lines, and each non-conductive area insulates the conductive areas by the first cutting portions, and the conductive areas include second cutting portions that cut the conductor lines without interfering with the conductivity between ends of each conductive area.

2. The planar body according to claim 1, wherein the first cutting portions are formed at intersections of the conductor lines of the mesh-like electrode.

3. The planar body according to claim 1, wherein the mesh pitch of the mesh-like electrode is 100 μm to 1,000 μm.

4. A capacitive touch switch comprising a plurality of the planar bodies recited in claim 1, wherein the planar bodies are laminated and bonded together via an adhesive layer.

5. The capacitive touch switch according to claim 4, wherein the conductive areas formed on one planar body are disposed to perpendicularly intersect the conductive areas formed on a different planar body.

6. A touch switch mounted to a front side of a display unit, the touch switch comprising: a substrate; multiple first electrodes formed on one side of the substrate and arranged at certain intervals; and multiple second electrodes formed on the other side of the substrate and arranged at certain intervals to form a grid pattern with the multiple first electrodes, wherein the first electrodes have multiple long and short conductor lines connected with each other that independently form a mesh pattern, the second electrodes have multiple long and short conductor lines connected with each other that independently form a mesh pattern, the touch switch comprises first auxiliary lines that do not connect the first electrodes to each other and that are formed between the first electrodes on the one side, and second auxiliary lines that do not connect the second electrodes to each other and that are formed between the second electrodes on the other side, and a grid pattern with equal intervals is formed by the conductor lines of the first electrodes, the first auxiliary lines, the conductor lines of the second electrodes, and the second auxiliary lines.

7. The touch switch according to claim 6, wherein the conductor lines of the first electrodes, the first auxiliary lines, or both of them formed on the one side of the substrate form continuous lines with the conductor lines of the second electrodes, the second auxiliary lines, or both of them formed on the other side of the substrate.

8. A touch switch comprising:
a first substrate; a second substrate disposed facing the first substrate;
multiple first electrodes formed on the first substrate, specifically on a side facing the second substrate, and arranged at certain intervals; and multiple second electrodes formed on the second substrate, specifically on a side away from the first substrate, and arranged at certain intervals to form a grid pattern with the multiple first electrodes, wherein the first electrodes have multiple long and short conductors lines connected with each other that independently form a mesh pattern, and the second electrodes have multiple long and short conductors lines connected with each other that independently form a mesh pattern, the touch switch comprises first auxiliary lines that do not connect the first electrodes to each other and that are formed between the first electrodes on the first substrate, specifically on the side facing the second substrate, and second auxiliary lines that do not connect the second electrodes to each other and that are formed between the second electrodes on the second substrate, specifically on the side away from the first substrate; and a grid pattern with equal intervals is formed by the conductor lines of the first electrodes, the first auxiliary lines, the conductor lines of the second electrodes, and the second auxiliary lines.

9. The touch switch according to claim 8, wherein the conductor lines of the first electrodes, the first auxiliary lines, or both of them formed on the first substrate form continuous lines with the conductor lines of the second electrodes, the second auxiliary lines, or both of them formed on the second substrate.

* * * * *